United States Patent
Volz et al.

[11] Patent Number: 5,493,237
[45] Date of Patent: Feb. 20, 1996

[54] INTEGRATED CIRCUIT CHIP TESTING APPARATUS

[75] Inventors: Keith L. Volz, Jamestown; Robert M. Renn, Pfafftown; Robert D. Irlbeck, Greensboro; Frederick R. Deak, Kernersville, all of N.C.

[73] Assignee: The Whitaker Corporation, Wilmington, Del.

[21] Appl. No.: 250,267

[22] Filed: May 27, 1994

[51] Int. Cl.$^6$ .................................................. G01R 31/00
[52] U.S. Cl. ........................... 324/754; 324/755; 439/70; 439/71; 439/73; 439/330
[58] Field of Search ............................... 324/754, 755, 324/760; 439/70, 71, 73, 330

[56] References Cited

U.S. PATENT DOCUMENTS

| | | | |
|---|---|---|---|
| 4,667,155 | 5/1987 | Coiner et al. | 324/754 |
| 4,940,935 | 7/1990 | Riley | 324/755 |
| 5,100,332 | 3/1992 | Egawa | 439/72 |
| 5,177,436 | 1/1993 | Lee | 324/754 |
| 5,247,250 | 9/1993 | Rios | 3234/754 |
| 5,302,853 | 4/1994 | Volz et al. | 257/707 |

Primary Examiner—Kenneth A. Wieder
Assistant Examiner—Kourosh Cyrus Khosravi
Attorney, Agent, or Firm—Timothy J. Aberle

[57] ABSTRACT

This disclosure relates to testing apparatus (10), preferably an LGA burn-in test socket, for an integrated chip (28). The apparatus (10), arranged for mounting on a planar electronic device (46), such as a printed circuit board, includes a frame member (12) for mounting to the planar electronic device (46), where the frame member (12) includes a central opening (22) extending between first and second surfaces, and dimensionally sized to receive the chip (28). Recesses (35) are provided for receiving an electronic interface member (18) mounting plural flexible electrical connectors (106), such as an elastomeric connector, as known in the art, for engaging the traces or pads of the chip to the planar device during testing. Further, plural recesses (40) extend from at least the first surface, where each recess includes a compression spring (41). Positioned over and for engagement with the frame member is a floatably mounted force applying member (14) having first and second parallel surfaces. A central opening (75), concentric with the central opening (22) of the frame member (12) is present. Additionally, plural posts (62) extend from the second parallel surface for receipt in respective recesses (44). Finally, camming levers (16) are provided for urging the force applying member toward the frame member, along with pivotal pusher members (78) responsive to the camming levers to engage and secure the chip during testing thereof.

6 Claims, 4 Drawing Sheets 5,493,237

INTEGRATED CIRCUIT CHIP TESTING APPARATUS

RELATED APPLICATIONS

The present invention relates to an improved integrated chip testing apparatus, preferably a Land Grid Array (LGA) type burn-in socket. Chip handling or testing apparatus is taught in copending application, Ser. No. 08/081,769, filed Jun. 23, 1993, where a preferred embodiment is directed to a burn-in test socket for integrated circuit chips having plural leads extending laterally therefrom. In co-pending application, Ser. No. 08/193,347, filed Feb. 8, 1994, the invention thereof relates to a chip testing apparatus which incorporates an adjustable contact force applying member. Each copending application is assigned to the assignee hereof.

BACKGROUND OF THE INVENTION

A preferred embodiment of this invention relates to an integrated circuit chip testing apparatus, such as an LGA type burn-in socket. An integrated circuit chip, as known in the art, may comprise a planar electronic device, such as illustrated in the copending applications, having a plurality of formed leads extending from the peripheral edges of the chip body, or it may comprise a ceramic substrate having an array of circuit elements or pads on a surface thereof. While the physical arrangement of the chip may be different, there are common problems and concerns regarding the testing thereof to ensure a functional chip. Accordingly, the further description will be directed to the applicability of this invention to an LGA burn-in testing apparatus. Notwithstanding, the inventive features hereof are suitable for use on other configurations of an integrated circuit chip.

Experience has shown that the catastrophic failure of an integrated circuit chip such as a microprocessor, will typically occur during the initial phase of the chip life. If the chip passes its initial operational phase, the life and reliability of the chip will have a relatively high probability.

In the case of a burn-in test socket, to precipitate early chip failure, the chip is "exercised" or powered while being subjected to relatively high external temperatures. Typically, a batch of chips is electrically powered in an oven where the temperature is maintained at approximately 150° C. for an extended period of time, such as 1,000 hours. This is referred to in the art as "burn-in".

During burn-in, a batch of chips may be mounted on a mother board, where the chips are electrically connected to respective circuit elements on the mother board by a suitable means, such as one or more flexible electrical connectors. Maintaining good electrical contact between the chip and the flexible electrical connector is very important. There have been many prior art approaches to the development of an effective way to provide a uniform and normal force that would ensure electrical integrity.

Through the practice of this invention, a highly reliable system is provided to effectively test chips, which system is operator friendly. The manner by which these attributes and others are achieved will be apparent in the specification which follows, particularly when read in conjunction with the accompanying drawings.

SUMMARY OF THE INVENTION

In a preferred embodiment, this invention is directed to testing apparatus for an integrated circuit "chip", where the chip is essentially a planar electronic device having plural traces or pads thereon for electrical interconnection to complementary traces or pads on a second planar electronic device upon which the apparatus may be mounted, such as a mother board. The apparatus comprises a frame member for mounting to the second planar electronic device, where the frame member includes a central opening extending between first and second surfaces, and dimensionally sized to receive the chip. The apparatus further includes means for receiving an electronic interface member mounting plural electrical interconnection means to engage the traces or pads during testing, and plural recesses extending from at least the first surface, where each recess includes a compression spring. A second member is a floatably mounted force applying member having first and second parallel surfaces and arranged to overlie the frame member. This second member includes a central opening concentric with the central opening of the frame member, and plural posts extending from the second parallel surface for receipt in the respective recesses. Finally, cooperative means are provided for urging the force applying member toward the frame member, and a second means responsive to the first means to engage and secure the chip during testing thereof.

BRIEF DESCRIPTION OF THE DRAWINGS

FIG. 3 is a full sectional view of the assembled apparatus of FIG. 2.

DETAILED DESCRIPTION OF THE PREFERRED EMBODIMENT

Figure 1:
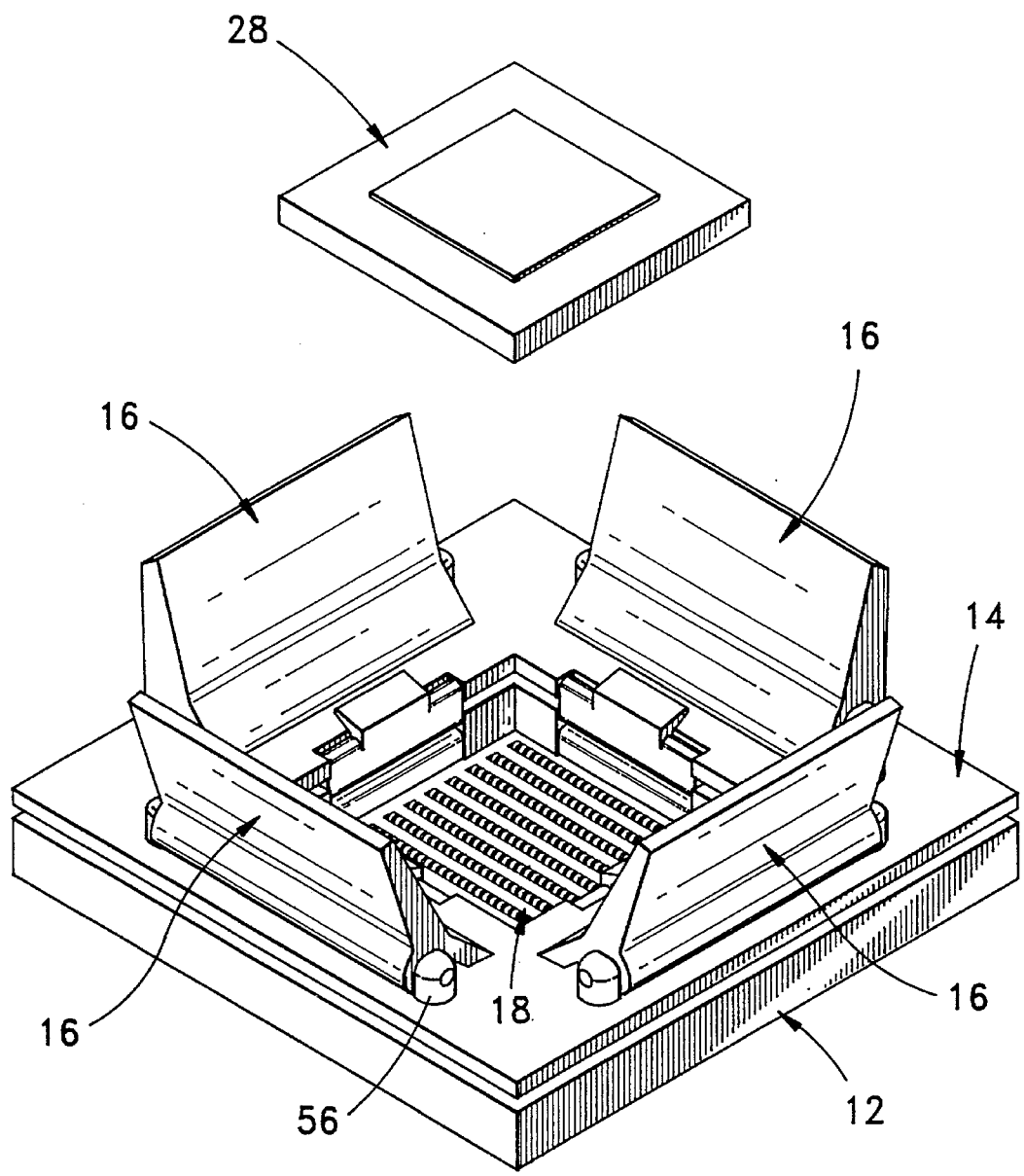
FIG. 1 is an exploded perspective view of the chip testing apparatus, less the interconnection interface, according to this invention.
Figure 2:
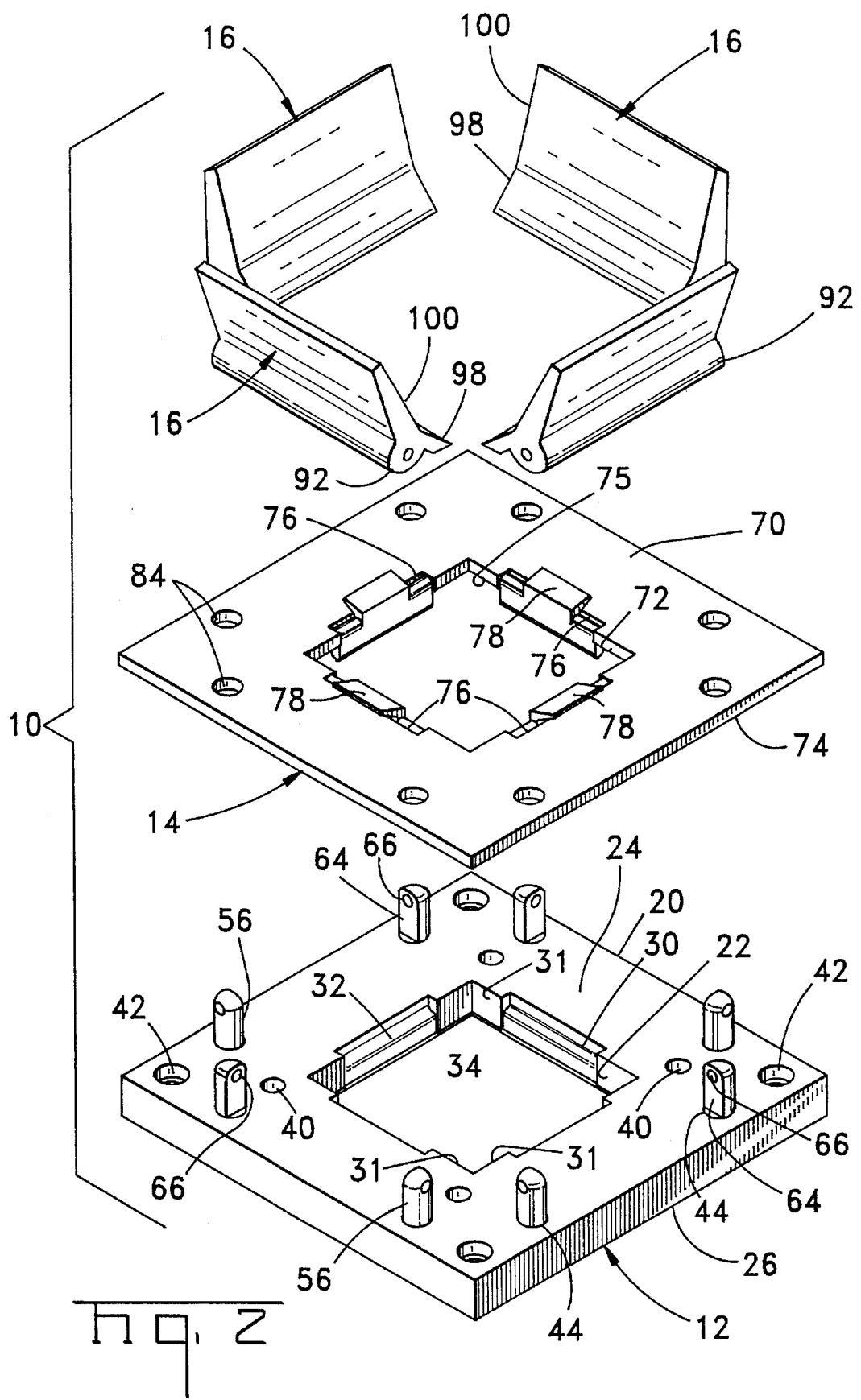
FIG. 2 is a perspective view of the assembled chip testing apparatus illustrating further the inclusion of the interconnection interface showing an array of flexible connectors, and an integrated chip positioned for entry into the apparatus.

This invention, as illustrated in the several Figures, relates to an improved integrated chip testing apparatus, preferably an LGA type burn-in test socket. FIGS. 1 and 2 illustrate the major components forming the testing apparatus 10 of this invention. Such components comprise a frame member 12, a force applying member 14, plural camming levers 16, and an electrical interconnection interface 18.

As best seen in FIGS. 1 and 3, the frame member 12, comprises a rectangular housing 20 having a central, opening 22 extending between upper and lower parallel surfaces 24,26, respectively. The opening 22, typically rectangular in configuration to receive a complementary sized integrated circuit chip 28, (FIG. 2), includes plural recesses 30, one on each edge 31 of the opening 22. Intermediate the respective recesses, tapered steps or camming surfaces 32 are provided. The function of the steps 32 will become apparent hereinafter when discussing the force applying member 14, and the operation of the testing apparatus 10. Along the bottom edge 34 of the opening 22, a continuous, peripheral recess 35 is provided to receive the electrical interconnection interface 18.

Disposed about the housing 20, extending from the upper surface 24, are plural holes 40, each arranged to receive a coiled compression spring 41 for interaction with the force applying member 14, as hereinafter explained. Additionally, the housing is further provided with two sets of through holes 42,44, where the holes 42 are located at the respective corners for mounting the frame member 12 to a planar electronic device 46 (FIGS. 3 and 4), such as a printed circuit board, as known in the art. The second set of holes 44, typically two aligned parallel with the respective edges 31 of the opening 22. The latter holes 44 actually consist of concentric portions 50,52 where the transition therebetween is an annular shoulder 54. Each such hole 44 is adapted to receive a post 56, having a head 58, a shank which receives a compression spring 60, extending between said shoulder 54 and head 58, and a remote end 62. The remote end 62 includes a flat portion 64 which is provided with a pin receiving opening 66.

The force applying member 14, an essentially planar member 70 to overlie the frame member 12, consists of a central opening 72 concentric with the housing opening 22, and of a size to allow loading of the chip 28 for seating engagement within the opening 22. Projecting from the lower surface 74 thereof are plural posts 76, where a respective post 76 is arranged to overlie and be received within a respective hole 40, whereby to align said force applying member 14 to said frame member 12.

The central opening 72, along the respective sides 75 thereof, are each provided with a cutout portion 76 for mounting a pivotal pusher member 78 having first and second arms 80,82, respectively. The manner by which such pusher member pivots, and the function of the respective arms will become apparent in the discussion relative to FIGS. 3 and 4. Finally, the force applying member 14 is provided with plural sets of through holes 84 to overlie and be received on the posts 56, specifically the respective remote ends 62 thereof, to align the respective components.

Figure 4:
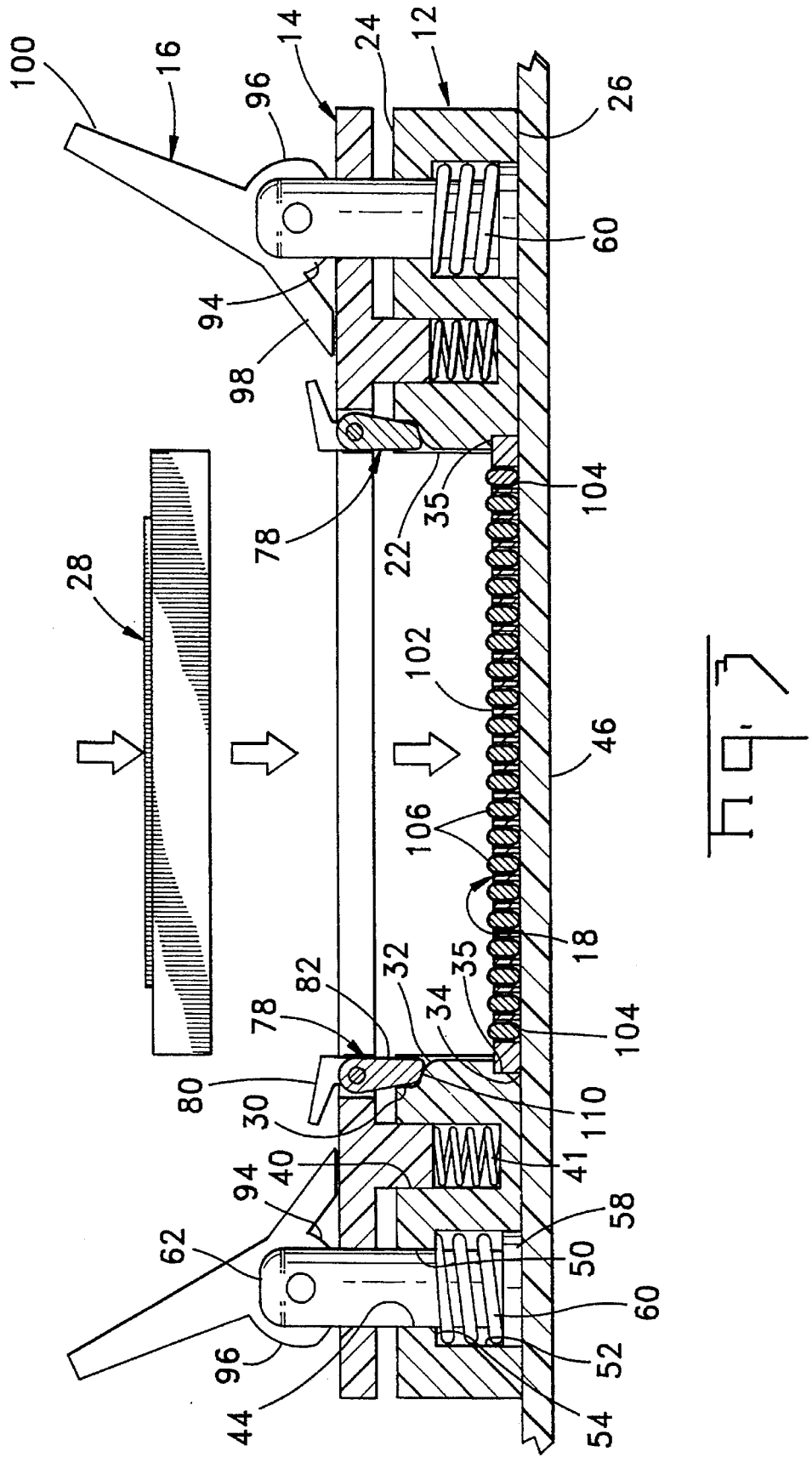
FIG. 4 is a full sectional view, similar to FIG. 3, showing the integrated chip securely latched therein for testing.
Figure 4:
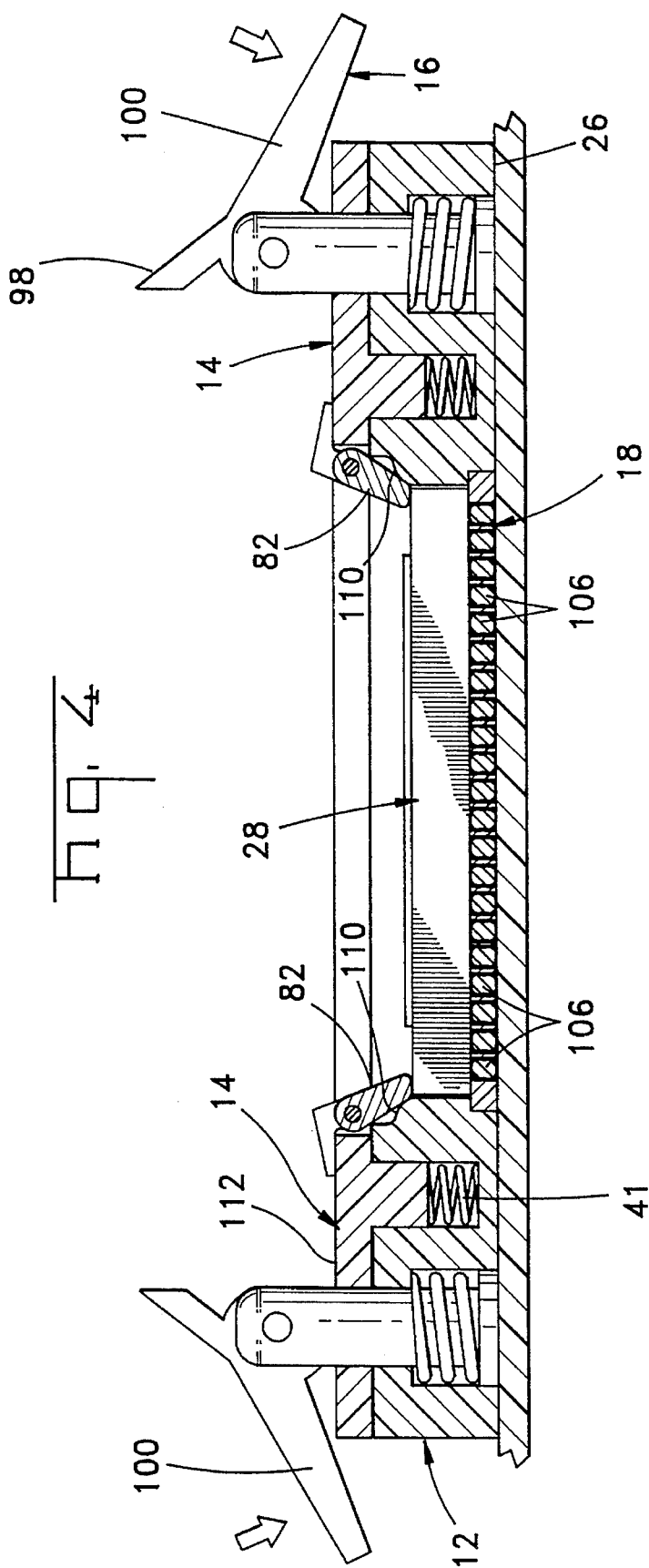

With the force applying member 14 suitably positioned over the frame member 12, plural camming levers 16 are mounted for pivoting movement between a pair of posts 56. The camming levers 16, as best seen in FIGS. 3 and 4, includes a central portion 92, where such portion has a minor radius 94 and a major or greater radius 96. Extending from the respective radii portions 94,96 are arms 98,100 respectively.

The final component of the testing apparatus 10 is the electrical interconnection interface 18. The interface comprises a planar member 102 having a plurality of through slots 104, with each said slot including a flexible electrical connector 106 consisting of an elastomeric core with a flexible film wrapped thereabout, where such film is provided with electrical circuitry thereon for electrically interconnecting complementary circuit traces on the circuit chip to appropriate traces on the underlying planar electronic device 46. A commercial flexible electrical connector suitable for incorporation into the testing apparatus hereof is a product known as AMPLIFLEX, a registered trademark of The Whitaker Corporation, Wilmington, Del., and licensed to AMP Incorporated, Harrisburg, Pa. By way of further understanding, the electrical circuitry are gold-plated on a nickel-clad thin copper foil which, in turn, is carried by a thin polymeric film. By the manner of manufacture, it is possible to achieve very finely-spaced circuit elements 3 mils wide and center-to-center spacings of about 7 mils, thus making this technology suitable for high density applications.

FIGS. 3 and 4 are two sectional views illustrating the sequence of loading and testing, respectively, of the testing apparatus of this invention. As noted in FIG. 3, the force applying member 14 is disposed a distance above the frame member 12 and the respective pivotal pusher members 78 are recessed, i.e. outside the opening 22, where the arm 82 rests on the sloping step 110. In this position, the chip 28 is free to be placed within the apparatus, note the direction arrows, upon the interconnection interface 18. Thereafter, as seen in FIG. 4, the respective arms 100 are pivoted downwardly toward the frame member. This pivoting action brings the major radius portion 96 into contact with the surface 112. By continuing the pivoting action, the force applying member 14 is urged downward toward the frame member 12, against the biasing of the compression spring 41. Concurrent with this relative movement of the members 12,14, the pusher arms 82 are forced to slide along the sloping step 110, then inwardly to an overriding position on the chip 28. As clearly illustrated in FIG. 4, the respective arms 82 are resting on the top surface of the chip to securely hold the chip for testing. By the use of this floating type of force applying member, a suitable normal force is maintained on the chip, which in turn has been pressed into intimate contact with the flexible connectors 106 within the electrical interconnection interface 18.

We claim:

1. Testing apparatus for an integrated circuit "chip", where said chip is generally a planar electronic device having plural traces thereon for electrical interconnection to complementary traces on a further planar electronic device upon which said apparatus is to be mounted, said apparatus comprising:

(a) a frame member for mounting to said further planar electronic device, where said frame member includes a central opening extending between first and second surfaces and is dimensionally sized to receive said chip, means for receiving an electronic interface member mounting plural electrical interconnection means for engaging said electrically conductive areas during testing, and plural recesses extending from at least said first surface, where each recess includes a compression spring;

(b) a floatably mounted force applying member having first and second generally parallel surfaces and arranged to overlie said frame member, a central opening concentric with said central opening of said frame member, plural posts extending from said second parallel surface for receipt in respective said recesses of said frame member;

(c) first means for urging said force applying member toward said frame member, said first means including an eccentric camming surface in contact with said first surface of said force applying member; and (d) second means responsive to said first means to engage and secure said chip during testing thereof.

2. The testing apparatus according to claim 1, wherein plural pairs of posts extend from the first surface of said frame member, and said force applying member includes complementary through holes for receiving said posts, whereby said force applying member is in sliding relationship with said posts.

3. The testing apparatus according to claim 2, wherein said first means are pivotal members mounted between two of said posts.

4. The testing apparatus according to claim 1, wherein the wall of said central opening of said frame member includes a cam riding shoulder.

5. The testing apparatus according to claim 4, wherein said second means comprises plural pivoting members mounted about said central opening of said frame member, and that said pivoting members include an arm adapted to ride along said shoulder into engagement with said test chip.

6. The testing apparatus according to claim 1, wherein said electronic interface member includes a plurality of through slots, where each slot contains an electrical connector comprising an elastomeric core having a thin flexible film wrapped thereabout, where said film is provided with circuitry thereon for electrically interconnecting the electrically conductive areas of the respective planar electronic devices.

* * * * *